United States Patent
Honda et al.

(10) Patent No.: US 8,404,595 B2
(45) Date of Patent: Mar. 26, 2013

(54) PLASMA PROCESSING METHOD

(75) Inventors: Masanobu Honda, Nirasaki (JP);
Manabu Sato, Nirasaki (JP); Yoshiki Igarashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 733 days.

(21) Appl. No.: 11/860,788

(22) Filed: Sep. 25, 2007

(65) Prior Publication Data

US 2008/0233757 A1 Sep. 25, 2008

Related U.S. Application Data

(60) Provisional application No. 60/854,714, filed on Oct. 27, 2006.

(30) Foreign Application Priority Data

Sep. 25, 2006 (JP) ................. 2006-258177

(51) Int. Cl.
| | |
|---|---|
| H01L 23/302 | (2006.01) |
| H01L 21/461 | (2006.01) |
| B23P 15/00 | (2006.01) |
| C03C 25/00 | (2006.01) |
| C03C 15/00 | (2006.01) |
| C03C 25/68 | (2006.01) |
| C23F 1/00 | (2006.01) |
| C23F 3/00 | (2006.01) |
| B44C 1/22 | (2006.01) |

(52) U.S. Cl. ........ 438/710; 438/689; 438/706; 438/709; 438/719; 438/723; 216/39; 216/58; 216/67; 216/79

(58) Field of Classification Search .................. None
See application file for complete search history.

(56) References Cited

U.S. PATENT DOCUMENTS

| | | | | |
|---|---|---|---|---|
| 4,812,712 | A * | 3/1989 | Ohnishi et al. | 315/176 |
| 6,426,299 | B1 * | 7/2002 | Ikeda | 438/700 |
| 2002/0142610 | A1 * | 10/2002 | Chien et al. | 438/710 |
| 2005/0022933 | A1 * | 2/2005 | Howard | 156/345.47 |
| 2005/0061445 | A1 * | 3/2005 | Koshiishi et al. | 156/345.47 |
| 2006/0037703 | A1 * | 2/2006 | Koshiishi et al. | 156/345.47 |

FOREIGN PATENT DOCUMENTS

| | | |
|---|---|---|
| JP | 10-12597 | 1/1998 |
| JP | 2006-270018 | 10/2006 |
| WO | WO 2005/124844 | 12/2005 |

OTHER PUBLICATIONS

Office Action issued Feb. 28, 2012 in Japanese Patent Application No. 2006-258177 (with English translation).

* cited by examiner

*Primary Examiner* — Duy Deo
*Assistant Examiner* — Stephanie Duclair
(74) *Attorney, Agent, or Firm* — Rothwell, Figg, Ernst & Manbeck, P.C.

(57) ABSTRACT

A plasma processing method for processing a target substrate uses a plasma processing apparatus which includes a vacuum evacuable processing vessel for accommodating the target substrate therein, a first electrode disposed in the processing vessel and connected to a first RF power supply for plasma generation and a second electrode disposed to face the first electrode. The method includes exciting a processing gas containing fluorocarbon in the processing vessel to generate a plasma while applying a negative DC voltage having an absolute value ranging from about 100 V to 1500 V or an RF power of a frequency lower than about 4 MHz to the second electrode. The target layer is etched by the plasma, thus forming recesses on the etching target layer based on the pattern of the resist layer.

6 Claims, 9 Drawing Sheets

PLASMA PROCESSING METHOD

FIELD OF THE INVENTION

The present invention relates to a plasma processing method for performing a plasma process on a target substrate to be processed such as a semiconductor wafer.

BACKGROUND OF THE INVENTION

In a manufacturing process of various semiconductor devices, widely employed to form a desired pattern on a desired layer on a target substrate such as a semiconductor wafer is a plasma etching process for etching the target substrate by using a plasma while employing a resist as a mask. Among various plasma etching apparatuses for performing such plasma etching process, a capacitively coupled parallel plate type etching apparatus has been most frequently employed.

The capacitively coupled parallel plate type plasma etching apparatus includes a pair of parallel plate type electrodes (an upper electrode and a lower electrode) disposed in a chamber, wherein by applying a high frequency power to either one of the two electrodes while concurrently introducing a processing gas into the chamber, a high frequency electric field is formed between the two electrodes. Then, the high frequency electric field converts the processing gas into a plasma, so that a plasma etching can be performed on a desired layer of the semiconductor wafer by using the plasma. Specifically, there is known a plasma etching apparatus which generates a plasma in a plasma state by applying a high frequency power for plasma generation to an upper electrode while applying a high frequency power for ion attraction to a lower electrode. With this plasma etching apparatus, a highly reproducible etching process can be carried out with a high etching selectivity.

Meanwhile, to keep up with a recent demand for micro-processing, the thickness of a photoresist film used as a mask is getting thinner, and the kind of the photoresist is switched from a KrF photoresist (i.e., a photoresist exposed to a laser beam of which emission source is a KrF gas) to an ArF photoresist (i.e., a photoresist exposed to a laser beam having a shorter wavelength of which emission source is an ArF gas) suitable for forming a pattern opening not greater than about 0.13 µm. Since, however, the ArF photoresist is of a low plasma resistance, it suffers a surface roughening during an etching that hardly occurs when the KrF photoresist is used. Accordingly, there occur such problems as a formation of longitudinal strips (striation) on inner wall surfaces of openings, an increase of critical dimension (CD) due to an enlargement of opening width which results from etching of shoulder portions thereof or the like. As a result, due to the thin thickness of the photoresist together with the above problems, it is difficult to form an etching hole with a sufficient etching selectivity against the mask.

To solve the above problems, International Publication No. WO2005/124844 (Claims, etc.) discloses a plasma processing method in which a plasma etching is performed while a DC voltage is being applied to the upper electrode, in order to perform the plasma etching with a high mask selectivity by allowing a plasma resistance of an organic mask layer such as a resist layer or the like to be maintained high. Further, Japanese Patent Laid-open Application No. H10-12597 (FIG. 2, etc.) discloses a plasma etching method in which a DC voltage is applied to a sub electrode, which is additionally provided besides upper and lower facing electrodes, so as to lower an electron energy distribution in a plasma.

In an etching, it is important to secure a sufficient etching selectivity of an etching target layer against a base layer serving as an etching stop layer as well as achieving a sufficient etching rate for etching the etching target layer. However, if the output of the high frequency power for plasma generation is increased to improve the etching rate, an electron density of the plasma also increases, resulting in a dissociation of a fluorocarbon-based processing gas such as $C_4F_6$, $C_4F_8$ or the like. As a consequence, the etching selectivity against the base layer deteriorates greatly, causing a film thickness loss of the base layer to be increased due to the etching. That is, the achievement of the high etching rate and the achievement of high etching selectivity against the base layer are in a trade-off relation in a specific application (e.g., in a combination of a specific processing gas, an etching target layer and a base layer), and so it is difficult to satisfy both requirements at the same time.

One example of such application is a case of etching an organic film such as a SiOC film by using a fluorocarbon gas such as $C_4F_6$, $C_4F_8$ or the like while employing an ArF photoresist as an etching mask. In this case, it is very difficult to secure a sufficient etching selectivity against a base layer serving as a stopper (e.g., a SiC film, a SiN film, a SiCN film or the like), while achieving a sufficient etching rate as well. Further, another example of such application is a case of etching a $SiO_2$ layer by using a CF based gas such as $C_4F_6$ or $C_4F_8$ while employing an ArF photoresist as an etching mask. In this case, it is also difficult to secure a sufficient etching rate while concurrently achieving a sufficient etching selectivity against a base layer (e.g., a Si substrate, a SiN film or the like) serving as a stopper.

The method of the International Publication No. WO2005/124844 is advantageous in that it enables micro-processing by suppressing a dissociation of, e.g., the fluorocarbon-based etching gas, suppressing an etching of an organic mask such as the resist layer, and preventing the surface roughening of the resist layer by means of applying the DC voltage to the upper electrode. However, the method dose not provide any specific description of the way to achieve a sufficient etching rate and a sufficient etching selectivity against the base layer in relation with an application concerning kinds of gases and films involved, and the like.

SUMMARY OF THE INVENTION

In view of the forgoing, the present invention provides a plasma processing method capable of achieving both a high etching rate and a high etching selectivity against a base layer when etching a target layer including a Si-containing film by using a silicon film, a silicon nitride film, a silicon carbide film, a silicon carbonitride film or the like as the base layer.

In accordance with a first aspect of the present invention, there is provided a plasma processing method for processing a target substrate, which, at least, includes a resist layer having a pattern formed thereon; an etching target layer having a Si-containing film under the resist layer; and a base layer under the etching target layer, by using a plasma processing apparatus including a vacuum evacuable processing vessel that accommodates the target substrate therein; a first electrode disposed in the processing vessel and connected to a first RF power supply for plasma generation, the first electrode also serving as a mounting table for mounting the target substrate thereon; and a second electrode disposed to face the first electrode, the method including processes of: exciting a processing gas containing fluorocarbon in the processing vessel to generate plasma while applying a negative DC voltage having an absolute value ranging from about 100 V to 1500 V or an RF power of a frequency lower than about 4 MHz to the second electrode; and etching the etching target layer by using the plasma, thus forming recesses on the etching target layer based on the pattern of the resist layer.

In the first aspect, the Si-containing film of the etching target layer may be a silicon dioxide ($SiO_2$) film, and the negative DC voltage having an absolute value ranging from about 100 V to 900 V may be applied to the second electrode.

Further, the Si-containing film of the etching target layer may be a low-k insulating film, and the base layer may be a silicon carbide (SiC), a silicon nitride (SiN) or a silicon carbonitride (SiCN), and a negative DC voltage having an absolute value ranging from about 1000 V to 1500 V may be applied to the second electrode.

In accordance with a second aspect of the present invention, there is provided a plasma processing method for processing a target substrate, which, at least, includes a resist layer having a pattern formed thereon; an etching target layer having a Si-containing organic film under the resist layer; and a base layer under the etching target layer, by using a plasma processing apparatus including a vacuum evacuable processing vessel that accommodates the target substrate therein; a first electrode disposed in the processing vessel and connected to a first RF power supply for plasma generation, the first electrode also serving as a mounting table for mounting the target substrate thereon; and a second electrode disposed to face the first electrode, the method includes processes of: exciting a processing gas containing fluorocarbon in the processing vessel to generate a plasma while applying a negative DC voltage having an absolute value ranging from about 1000 V to 1500 V or an RF power of a frequency lower than about 4 MHz to the second electrode, thus generating a plasma; and etching the etching target layer by using the plasma, thus forming recesses on the etching target layer based on the pattern of the resist layer.

In the second aspect, an etching selectivity of the Si-containing organic film against the base layer (a ratio of an etching rate of the Si-containing organic film to an etching rate of the base layer) may be about 5 or higher.

Further, the Si-containing organic film may be a low-k insulating film, and the base layer may be a silicon carbide (SiC), a silicon nitride (SiN) or a silicon carbonitride (SiCN). In this case, a ratio of an opening width or diameter of the recess formed by the etching to an opening width or diameter of the initial pattern of the resist layer may be 1.2 or less.

Further, the first electrode may be connected to the second RF power supply which generates an RF power of a frequency lower than that of an RF power from the first RF power supply.

Further, at least a part of the second electrode may be made of a silicon-containing material. Furthermore, the fluorocarbon gas may be $C_4F_8$, $C_5F_8$, $C_4F_6$ or $C_6F_6$.

In accordance with a third aspect of the present invention, there is provided a computer-executable control program, which controls, when executed, the plasma processing apparatus to perform the plasma processing method described in the first or second aspect.

In accordance with a fourth aspect of the present invention, there is provided a computer-readable storage medium for storing therein a computer executable control program, wherein, when executed, the control program controls the plasma processing apparatus to perform the plasma processing method described in the first or second aspect.

In accordance with a fifth aspect of the present invention, there is provided a plasma processing apparatus including: a vacuum evacuable processing vessel for accommodating a target substrate therein; a first electrode disposed in the processing vessel, the first electrode mounting the target substrate thereon and being connected to a first RF power supply; a second electrode disposed to face the first electrode; and a control unit for controlling the plasma processing method described in the first or second aspect to be carried out in the processing vessel.

In accordance with the present invention, it is possible to etch an etching target layer at a high etching rate by a plasma generated by applying a negative DC voltage having an absolute value ranging from about 100 V to 1500 V or an RF power of a frequency lower than about 4 MHz to a second electrode disposed to face a first electrode also serving as a mounting table for mounting the target substrate and exciting a processing gas containing fluorocarbon in the processing vessel, and, at the same time, sufficient etching selectivity against a base layer such as a silicon, a silicon nitride film, silicon carbide film or a silicon carbonitride film can be obtained.

Further, by controlling the DC voltage applied to the second electrode, a resist deformation such as a shoulder damage, or striation generation can be prevented, whereby, a high etching density can be achievable.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Hereinafter, embodiments of the present invention will be described in detail with reference to the accompanying drawings.

Figure 1:
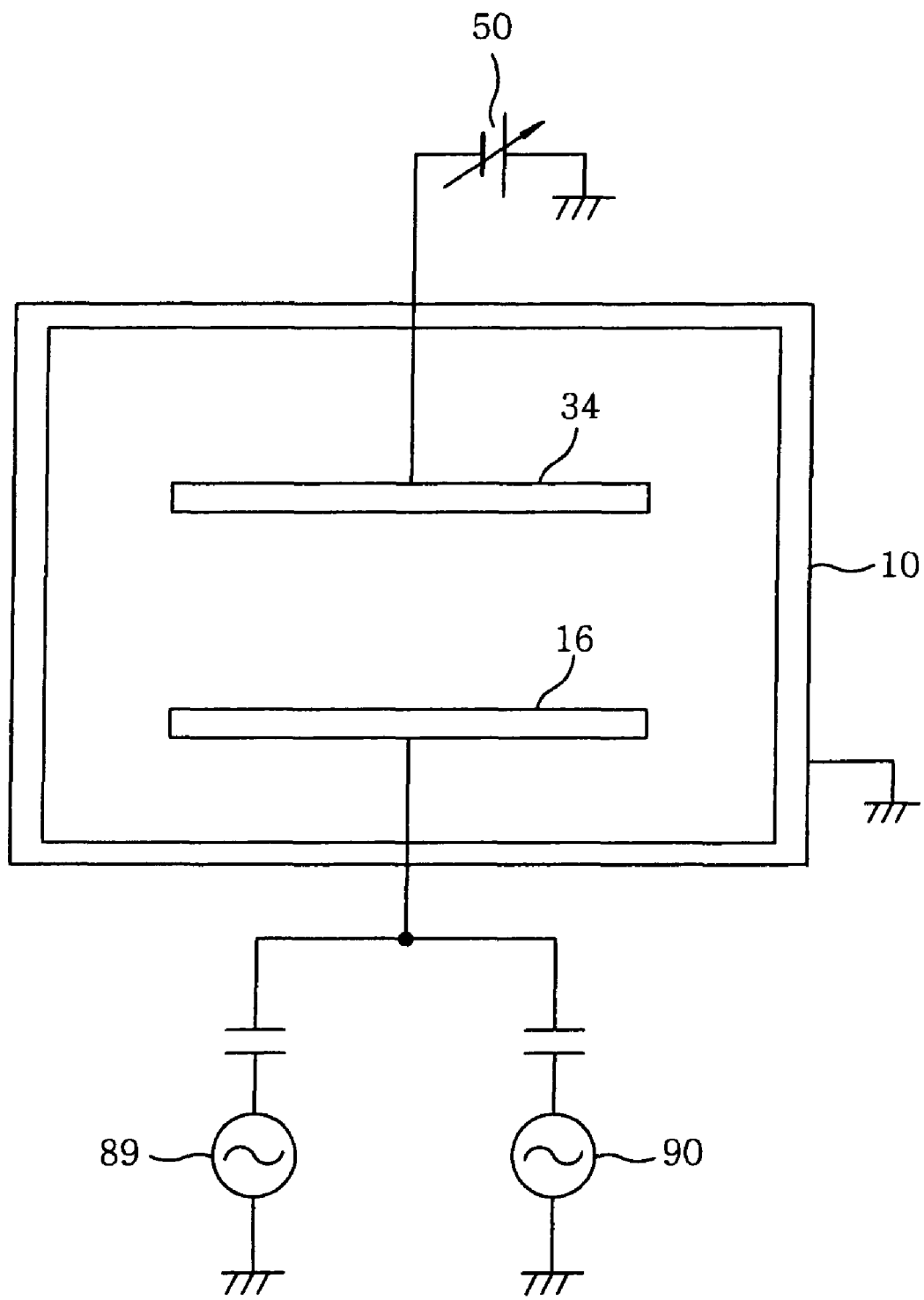
FIG. 1 is a schematic cross sectional view showing a plasma etching apparatus suitable for performing a plasma processing method in accordance with an embodiment of the present invention.

FIG. 1 is a schematic cross sectional view of a plasma etching apparatus 100 in accordance with an embodiment of the present invention. The plasma etching apparatus 100 is a type in which dual radio frequency (RF) powers of different frequencies are applied to a lower electrode, wherein a RF power of frequency of, e.g., about 40 MHz for plasma generation is applied from a first RF power supply 89 to a susceptor 16 serving as the lower electrode, and, at the same time, another RF power of frequency of, e.g., about 2 MHz for ion attraction is applied from a second RF power supply 90 to the susceptor 16. Further, as shown in FIG. 1, a variable DC power supply 50 is connected to an upper electrode 34 to apply a specific DC voltage thereto. This plasma etching apparatus 100 will now be explained in further detail in conjunction with FIG. 2.

Figure 2:
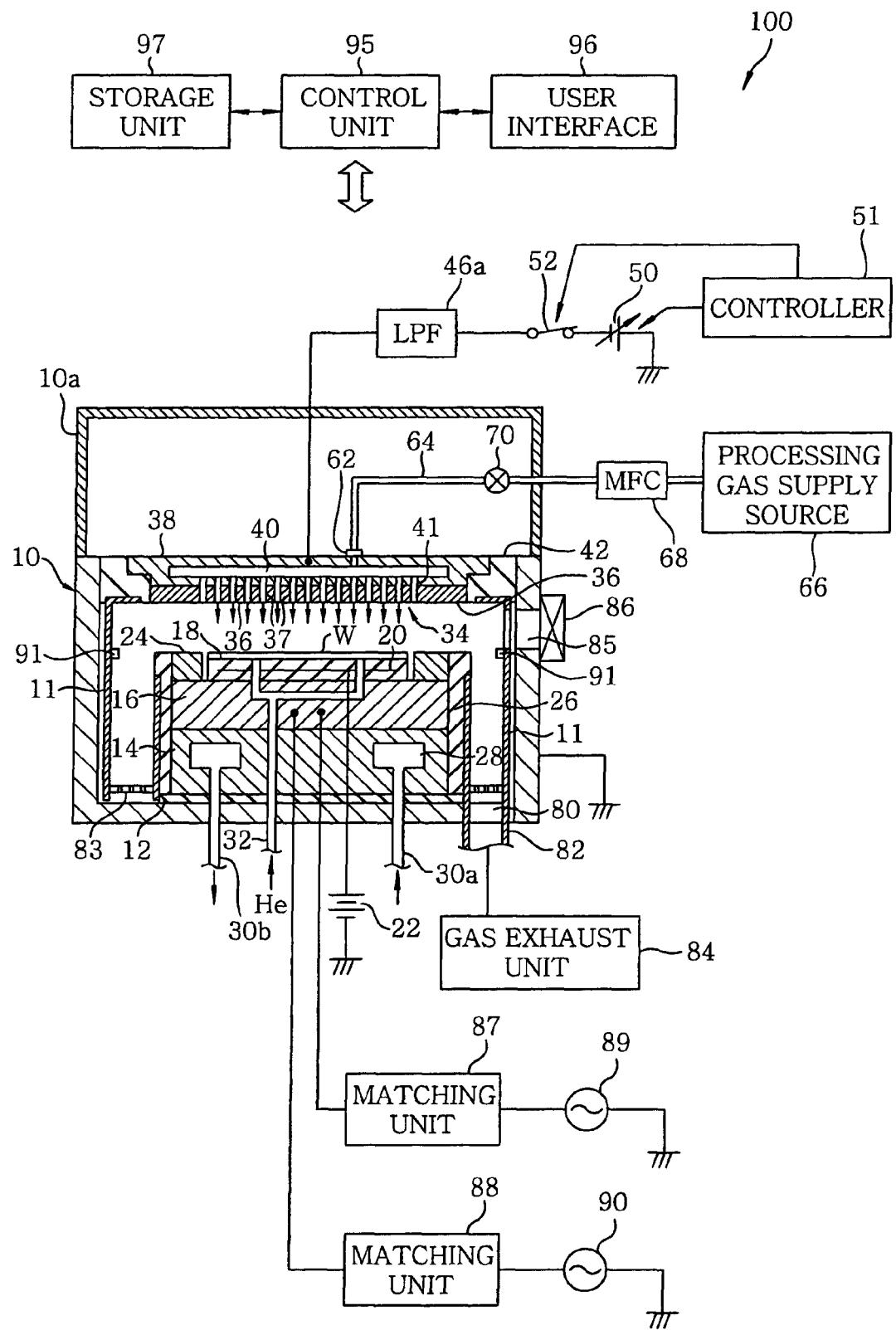
FIG. 2 sets forth another schematic cross sectional view showing the plasma processing apparatus suitable for performing the plasma processing method in accordance with the embodiment of the present invention.

FIG. 2 presents a schematic cross sectional view of the plasma etching apparatus 100 which is suitable for performing a plasma processing method in accordance with the present invention. The plasma etching apparatus 100 is configured as a capacitively coupled parallel plate type plasma etching apparatus including a substantially cylindrical chamber (processing vessel) 10 made of, e.g., aluminum of which surface is anodically oxidized. The chamber 10 is frame grounded.

A columnar susceptor support 14 is disposed at a bottom portion of the chamber 10 via an insulating plate 12 made of, e.g., ceramic. The susceptor support 14 made of, e.g., aluminum supports thereon the susceptor 16. The susceptor 16 serves as a lower electrode, while mounting thereon a substrate to be processed, e.g., a semiconductor wafer W.

Disposed on the top surface of the susceptor 16 is an electrostatic chuck 18 which attracts and holds the semiconductor wafer W with a help of an electrostatic force. The electrostatic chuck 18 is configured to have therein an electrode 20 sandwiched between a pair of insulating layers or insulating sheets. The electrode 20 is made of a conductive film and is connected to a DC power supply 22. The semiconductor wafer W is attracted and held on the electrostatic chuck 18 by the electrostatic force such as a Coulomb force generated by a DC voltage applied from the DC power supply 22.

Disposed on the periphery of the top surface of the susceptor 16 to surround the electrostatic chuck 18 (semiconductor wafer W) is a conductive focus ring (calibration ring) 24 made of, e.g., silicon, for improving etching uniformity. A cylindrical inner wall member 26 is disposed on lateral surfaces of the susceptor 16 and the susceptor support 14.

A coolant path 28 is provided inside the suscpetor support 14 circumferentially, for example. A coolant, e.g., cooing water, of a specific temperature is supplied from a chiller unit (not shown) located at outside into the coolant path 28 through lines 30a and 30b to be circulated therein, whereby a processing temperature of the semiconductor wafer W on the susceptor 16 can be controlled by controlling the temperature of the coolant.

Further, a thermally conductive gas, e.g., He gas is supplied from a thermally conductive gas supply unit (not shown) into a space between the top surface of the electrostatic chuck 18 and the backside of the semiconductor wafer W through a gas supply line 32.

An upper electrode 34 is installed above the susceptor 16 serving as the lower electrode so as to face the susceptor 16 in parallel. A space between the upper and the lower electrode 34 and 16 becomes a plasma generation space. The upper electrode 34 forms a facing surface, i.e., a surface being in contact with the plasma generation space while facing the semiconductor wafer W on the susceptor 16.

The upper electrode 34 is held by an insulating shield 42 at a ceiling portion of the chamber 10. The upper electrode 34 includes an electrode plate 36 and an electrode support 38. The electrode plate 36 forms the facing surface to the suscpetor 16 and is provided with a plurality of gas injection openings 37. The electrode support 38 holds the electrode plate 36 such that the electrode plate 36 can be detachably attached to the electrode support 38. The electrode support 38 is of a water cooling type and is made of a conductive material, e.g., aluminum of which surface is anodically oxidized. Preferably, the electrode plate 36 is a low-resistance conductor or semiconductor of a low Joule heat. In order to prevent a generation of striation or a damage of shoulder portions of a photorsist by strengthening the photoresist, the electrode plate 36 is preferably made of a material containing silicon. Thus, the electrode plate 36 is preferably made of silicon or SiC. A gas diffusion space 40 is provided in the electrode support 38. A plurality of gas holes 41 extending downward from the gas diffusion space 40 is provided to communicate with the gas injection openings 37.

A gas inlet opening 62 is formed in the electrode support 38 to introduce a processing gas into the gas diffusion space 40. A processing gas supply line 64 is connected to the gas inlet opening 62, and a processing gas supply source 66 is connected to the processing gas supply line 64. A mass flow controller (MFC) 68 and a opening/closing valve 70 are sequentially provided from the upstream side in the processing gas supply line 64. Further, a processing gas containing a fluorocarbon gas $C_xF_y$ (x, y represent stoichiometric numbers) such as $C_4F_8$ is supplied from the processing gas supply source 66 into the gas diffusion space 40 via the processing gas supply line 64 to be finally injected into the plasma generation space in a shower shape through the gas injection openings 37. That is, the upper electrode 34 functions as a shower head for supplying the processing gas.

A variable DC power supply 50 is electrically connected to the upper electrode 34 via a low pass filter (LPF) 46a. The variable DC power supply 50 may be a bipolar power source. The power feed of the variable DC power supply 50 can be on-off controlled by an on/off switch 52. The polarity, current and voltage of the variable DC power supply 50 and the on/off operation of the on/off switch 52 are controlled by a controller (control device) 51.

The LPF 46a serves to trap RF powers from a first and a second RF power supply to be described later. The LPF 46a preferably includes an LR filter or an LC filter.

A cylindrical ground conductor 10a extends upward from a sidewall of the chamber 10 to be located at a position higher than the upper electrode 34. The ground conductor 10a has a ceiling wall at the top thereof.

A first RF power supply 89 is electrically connected via a matching unit 87 to the susceptor 16 serving as the lower electrode, and a second RF power supply 90 is also connected to the susceptor 16 via a matching unit 88. The first RF power supply 89 outputs an RF power of a frequency not lower than 27 MHz, e.g., 40 MHz. The second RF power supply 90 outputs an RF power of a frequency not greater than 13.56 MHz, e.g., 2 MHz.

The matching units 87 and 88 function to match a load impedance to internal (or output) impedances of the first and the second RF power supply 89 and 90, respectively, and render the internal impedances of the first and the second RF power supply 89 and 90 be seemingly matched to each other when a plasma is generated in the chamber 10.

A gas exhaust port 80 is provided in the bottom of the chamber 10, and a gas exhaust unit 84 is connected to the gas exhaust port 80 via a gas exhaust line 82. The gas exhaust unit 84 has a vacuum pump such as a turbo molecular pump or the like, and can depressurize the chamber 10 to a desired vacuum level. Further, a loading/unloading port 85, through which the semiconductor wafer W is loaded and unloaded, is provided in a sidewall of the chamber 10. The loading/unloading port 85 can be opened and closed by a gate valve 86. Further, a deposition shield 11 is detachably installed at the inner wall of the chamber 10 so as to prevent etching byproducts (deposits) from being attached to the chamber 10. That is, the deposition shield 11 serves as a chamber wall. Further, the deposition shield 11 is also provided on the outer surface of the inner wall member 26. A gas exhaust plate 83 is provided at a lower portion of the chamber 10 between the deposition shield 11 at the inner wall of the chamber 10 and the deposition shield 11 at the inner wall member 26. The deposition shield 11 and the gas exhaust plate 83 can be appropriately formed by covering an aluminum material with ceramic such as $Y_2O_3$ or the like.

A conductive member (GND block) 91 DC-connected to the ground is provided to a portion of the deposition shield forming the chamber inner wall at a height position substantially identical with the height of the wafer W. With this configuration, an abnormal discharge can be prevented.

Each component of the plasma etching apparatus 100 is connected to and controlled by a control unit (for controlling the whole components) 95. Further, a user interface 96 is connected to the control unit 95, wherein the user interface 96 includes, e.g., a keyboard for a process manager to input a command to operate the plasma processing apparatus, a display for showing an operational status of the plasma processing apparatus and the like.

Moreover, connected to the control unit 95 is a storage unit 97 for storing therein, e.g., control programs to be used in realizing various processes, which are performed in the plasma processing apparatus under the control of the control unit 95 and programs or recipes to be used in operating each component of the plasma etching apparatus to carry out processes in accordance with processing conditions. The recipes can be stored in a hard disk or a semiconductor memory, or can be set at a certain position of the storage unit 97 while being recorded on a portable storage medium such as a CDROM, a DVD and the like.

When a command or the like is received from the user interface 96, the control unit 95 retrieves a necessary recipe from the storage unit 97 and executes the recipe. Accordingly, a desired process is performed in the plasma etching apparatus 100 under the control of the control unit 95. The plasma etching apparatus 100 includes this control unit 95.

When an etching process is performed by the plasma etching apparatus 100 having the aforementioned configuration, the gate valve 86 is first opened, and a semiconductor wafer W to be processed is loaded into the chamber 10 through the loading/unloading port 85 to be mounted on the susceptor 16. Then, a processing gas for the etching is supplied from the processing gas supply source 66 into the gas diffusion space 40 at a specific flow rate and is then supplied into chamber 10 via the gas holes 41 and the gas injection openings 37. While the processing gas is being supplied into the chamber 10, the chamber 10 is evacuated by the gas exhaust unit 84 so that the internal pressure of the chamber 10 is maintained at a set value within a range from, e.g., about 0.1 to 150 Pa. Here, anyone of various conventionally available gases can be used as a processing gas. For example, a halogen containing gas represented by a fluorocarbon gas $C_xF_y$ such as $C_4F_6$, $C_4F_8$, $C_5F_8$ or the like can be appropriately utilized. Further, the processing gas may additionally contain other gases such as Ar, $O_2$, $N_2$ and the like.

After the processing gas for the etching is introduced into the chamber 10, an RF power for plasma generation is applied from the first RF power supply 89 to the susceptor 16, i.e., the lower electrode, at a specific power level, and, at the same time, an RF power for ion attraction is applied from the second RF power supply 90 to the susceptor 16 at a certain power level. Further, a DC voltage is applied from the variable DC power supply 50 to the upper electrode 34. Moreover, a DC voltage is applied from the DC power supply 22 to the electrode 20 of the electrostatic chuck 18, whereby the semiconductor wafer W is fixed on the susceptor 16.

The processing gas injected from the gas injection openings 37 formed in the electrode plate 36 of the upper electrode 34 is converted into a plasma by a glow discharge generated between the upper electrode 34 and the susceptor 16 serving as the lower electrode by the RF powers applied thereto. By radicals or ions generated from the plasma, a target surface of the semiconductor wafer W is etched.

In the plasma etching apparatus 100, since the RF power in an RF range (e.g., 10 MHz or higher) is applied to the susceptor 16 serving as the lower electrode from the first RF power supply 89, the plasma can be generated at a high density in a desirable state, and it becomes possible to form a high-density plasma even under a lower pressure condition.

In the present embodiment, when the plasma is generated as described above, a DC voltage of a specific polarity and magnitude is applied from the variable DC power source 50 to the upper electrode 34. At this time, the voltage applied from the variable DC power source 50 is preferably controlled by the controller 51 such that the magnitude of a self bias voltage $V_{dc}$ on the surface of the upper electrode 34 (i.e., the surface of the electrode plate 36) becomes greater. That is, the absolute value of the $V_{dc}$ on the surface of the upper electrode 34 is increased to the extent that a desired (appropriate) sputter effect can be realized in the surface of the upper electrode 34 (the surface of the electrode plate 36). When the plasma is generated by the application of the RF power from the first RF power supply 89, an amount of polymer may be attached to the upper electrode 34. However, by applying a DC voltage in a proper range from the variable DC power supply 50 to the upper electrode 34, the polymer attached thereat can be sputtered, and the surface of the upper electrode 34 can be cleaned. Further, an optimum amount of polymer can be supplied to the semiconductor wafer W, whereby a surface roughness of the photoresist film can be prevented.

Moreover, the upper electrode 34 itself can be made to be sputtered by adjusting the voltage from the variable DC power source 50 to supply the electrode material to the surface of the semiconductor wafer W, so that an amount of carbide is formed on the surface of the photoresist film to thereby strengthen the photoresist film. Further, the sputtered electrode material reacts with F radicals in the fluorocarbon-based processing gas, thereby consuming the F radicals in the processing gas. Therefore, the ratio of F radicals in the plasma decreases, which makes it difficult to etch the photoresist film or the base layer. When the electrode plate 36 is formed of silicon or a silicon-containing material such as SiC, silicon sputtered from the surface of the electrode plate 36 would react with polymer to form SiC on the surface of the photoresist film, so that the photoresist film would become very strong. Since Si is likely to react with F radicals, F radicals can be easily consumed, so that the effect of improving the selectivity of a target layer against the base layer can be further enhanced. Accordingly, the material of the electrode plate 36 is preferably to be a silicon-containing material. In this case, in place of controlling the voltage applied from the variable DC power supply 50, the current or power applied may be controlled.

Figure 3:
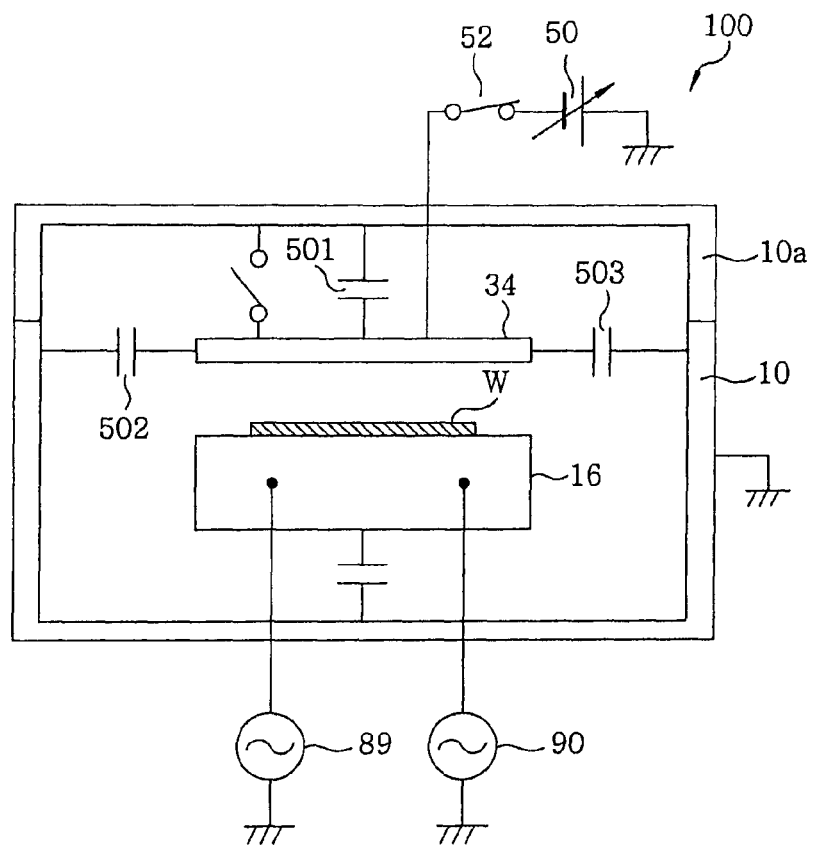
FIG. 3 presents a diagram showing an electric state of an upper electrode of the plasma etching apparatus shown in FIG. 2.

Furthermore, when a DC voltage is applied to the upper electrode 34, the application of the DC voltage to the upper electrode 34 becomes useless if the upper electrode 34 is grounded. Therefore, the upper electrode 34 needs to be DC-floated, as schematically illustrated in FIG. 3. Dielectric materials are actually provided at the locations of capacitors 501, 502 and 503 in FIG. 3, so that the upper electrode 34 is DC-floated through the dielectric materials with respect to the processing chamber 10 and the grounding conductor 10$a$. Further, the RF powers applied from the RF power supplies 89 and 90 to the lower electrode 16 pass through a processing space to reach the upper electrode 34 and arrive via the capacitors 501, 502 and 503 at the processing chamber 10 and the grounding conductor 10$a$ which are grounded.

Frequencies applicable to the first and the second RF power are exemplified as follows. As the first RF power, 13.56 MHz, 27 MHz, 40 MHz, 60 MHz, 80 MHz, 100 MHz or 160 MHz can be used, and as the second RF power, 380 kHz, 800 kHz, 1 MHZ, 2 MHz, 3.2 MHz or 13.56 MHz can be used, wherein appropriate combination of them may be selected depending on processes involved.

Figure 4:
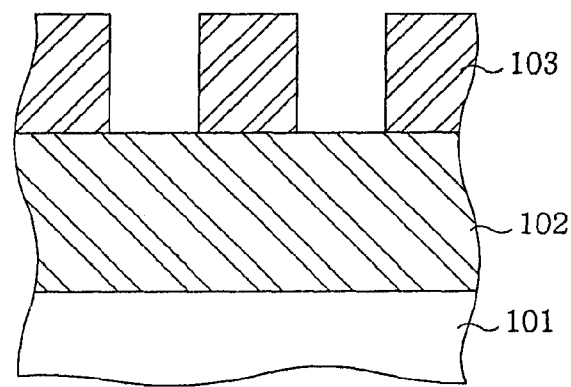
FIG. 4 provides a longitudinal cross sectional view showing a major surface portion of a wafer W before etching is performed.
Figure 5:
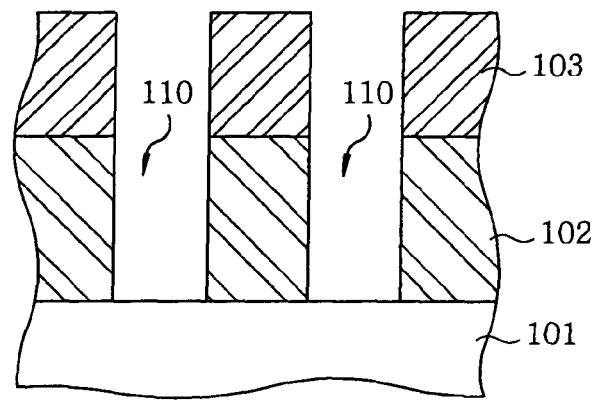
FIG. 5 depicts a longitudinal cross sectional view showing a major surface portion of the wafer W after etching is performed.

FIGS. 4 and 5 provide longitudinal cross sectional views showing major parts of a semiconductor wafer W to be etched by the plasma etching apparatus 100.

A base layer 101 is formed on a Si substrate (wafer W) (not shown), and an etching target layer 102 is formed on the base layer 101. Further, formed on the etching target layer 102 is a resist layer 103 such as an ArF resist which has a pattern formed by a photolithography technique.

A plasma processing method in accordance with a first embodiment of the present invention is directed to the case of etching the target layer 102 based on a pattern of the resist layer 103 while using the base layer 101 as an etching stopper to thereby form such recesses 110 as holes or grooves, wherein the base layer 101 is, e.g., a SiC film, a SiN film, a SiCN film or the like, and the etching target layer is a low-k film (insulating film having a low dielectric constant) such as a SiOC film, a SiOCH film or the like.

In the first embodiment, etching conditions for the etching of the etching target layer 102 are as follows.

Preferably, a gas containing a rare gas such as Ar, a fluorocarbon gas, such as $C_xF_y$ represented by $C_4F_8$, $C_5F_8$, $C_4F_6$, $C_6F_6$ or the like, $C_xH_yF_z$, $C_xF_yO$ or the like (x, y, z represent stoichiometric numbers) and at least one of $N_2$, $O_2$, CO and the like can be employed as a processing gas. Preferable combinations of these gases can be, for example, $Ar/C_5F_8/N_2$, $Ar/C_4F_8/N_2$, $Ar/C_4F_8/N_2/O_2$, $C_4F_8/Ar/N_2/CO$ and the like.

As for the flow rate of the processing gas, a flow rate of Ar is preferably in a range from about 100 to 2000 mL/min (sccm) and, more preferably, in a range from about 800 to 1200 mL/min (sccm). Further, a flow rate of the fluorocarbon gas such as $C_5F_8$, $C_4F_8$ or the like is preferably in a range from about 1 to 30 mL/min (sccm) and, more preferably, in a range from about 4 to 10 mL/min (sccm). The flow rate of $N_2$, $O_2$CO or the like is preferably in a range from about 0 to 300 mL/min and, more preferably, in a range from about 50 to 200 mL/min (scam).

A processing pressure is preferably set to be in a range from about 1.33 to 20 Pa and, more preferably, from about 4 to 13.3 Pa.

The temperature of the wafer W is preferably controlled to be in a range from about 20 to 100° C.

The frequency of the first RF power from the first RF power supply 89 is preferably set to be about 40 MHz and its power level is preferably set to be in a range from about 300 to 3000 W. Further, the frequency of the second RF power from the second RF power supply 90 is preferably set to be about 2 MHz and its power level is preferably set to be in a range from about 0 to 3000 W.

Further, a DC voltage applied to the upper electrode 34 from the variable DC power supply 50 is preferably set to be in a range from about −1500 V to −100 V. More preferably, so as to sufficiently increase the etching selectivity of the etching target layer 102 against the base layer 101 such as a SiC film or the like, the DC voltage is set to be in a range from about −1500 to −1000 V. If the DC voltage applied to the upper electrode is higher than −100 V (i.e., if the absolute value of the DC voltage is smaller than 100 V for a negative voltage), there is likelihood that deposits are accumulated on the surface of the upper electrode 34 during the etching. If the DC voltage is lower than −1500 V (i.e., if the absolute value of the DC voltage is greater than 1500 V), shoulder portions of the patterned resist layer 103 are likely to be cut, resulting in increase in diameters or widths of openings formed on the etching target layer 102 such as the SiOC film.

Moreover, a plasma processing method in accordance with a second embodiment of the present invention is directed to the case of etching the target layer 102 based on a pattern of the resist layer 103 while using the base layer 101 as an etching stopper to thereby form such recesses 110 as holes or grooves wherein the base layer 101 is a Si layer (single crystalline), a SiN film or the like and the etching target layer is a $SiO_2$ film.

In the second embodiment, etching conditions for the etching of the etching target layer 102 are as follows.

Preferably, a gas containing a rare gas such as Ar, a fluorocarbon gas, such as $C_xF_y$ represented by $C_4F_8$, $C_5F_8$, $C_4F_6$, $C_6F_6$ or the like, $C_xF_yO$, $C_xF_{2x+2}$ or the like (x, y represent stoichiometric numbers), and at least one of $N_2$, $O_2$, CO and the like can be employed as a processing gas. Preferred combinations of these gases may be, for example, $Ar/C_5F_8/O_2$, $Ar/C_4F_8/O_2$, $Ar/C_4F_8/N_2/O_2$, $C_4F_8/Ar/O_2/CO$ and the like.

As for the flow rate of the processing gas, a flow rate of Ar is preferably in a range from about 0 to 2000 mL/min (sccm) and, more preferably, in a range from about 100 to 500 mL/min (sccm). Further, a flow rate of $C_5F_8$ or $C_4F_8$ is preferably in a range from about 10 to 200 mL/min (scam) and, more preferably, in the range from about 50 to 80 mL/min (scam). The flow rate of $N_2$, $O_2$ or CO is preferably in a range from about 10 to 200 mL/min (scam) and, more preferably, in a range from about 30 to 100 mL/min (scam).

The temperature of the wafer W is preferably controlled to be in a range from about −20 to 40° C.

The frequency of the first RF power from the first RF power supply 89 is preferably set to be about 40 MHz and its power level is preferably set to be in a range from about 300 to 5000 W. Further, the frequency of the second RF power from the second RF power supply 90 is preferably set to be about 2 MHz and its power level is preferably set to be in a range from about 2000 to 6000 W.

Further, a DC voltage applied to the upper electrode 34 from the variable DC power supply 50 is preferably set to be in a range from about −900 V to −100 V, in order to sufficiently increase the etching selectivity of the etching target layer 102, i.e., the $SiO_2$ film, against the base layer 101, i.e., the Si layer, the SiN film or the like. If the DC voltage applied to the upper electrode is equal to or higher than −100 V (i.e., if the absolute value of the DC voltage is smaller than 100 V for a negative voltage), there is likelihood that deposits are accumulated on the surface of the upper electrode 34 during the etching. If the DC voltage is lower than −900 V (i.e., if the absolute value of the DC voltage is greater than 900 V), shoulder portions of the patterned resist layer 103 are likely to be cut, resulting in increases in the diameters or widths of openings formed on the etching target layer 102.

It is believed that in the plasma etching methods in accordance with the first and the second embodiment described above, both the high etching rate and the high etching selectivity of the target layer against the base layer 101 can be obtained for the following reasons.

During a plasma etching, deterioration of the selectivity of the etching target layer 102 against the base layer 101 is caused due to an increase in the number of F radicals. Specifically, if an electron density is increased by enhancing the RF output from the first RF power supply 89 for the purpose of improving an etching rate, dissociation of active species in a plasma progresses. As a consequence, the number of the F radicals having a strong etching effect on the base layer 101 increases, resulting in the deterioration of the etching selectivity. Thus, the electrode plate 36 of the upper electrode 34 in the plasma etching apparatus is made of a silicon containing material, e.g., silicon, thereby triggering an interaction, such as sputtering or etching, between the electrode plate 36 and $Ar^+$ ions or $CF_x^+$ ions in the plasma. As a result of the interaction, Si emitted from the electrode plate 36 reacts with the F radicals in the plasma, whereby reaction products are generated, and the F radicals are consumed. The reaction products are removed through evacuation. By this mechanism, a scavenging effect of removing the F radicals from the plasma is enhanced, so that the number of the F radicals decreases, and the selectivity of the etching target layer 102 against the base layer 101 can be improved.

Figure 6:
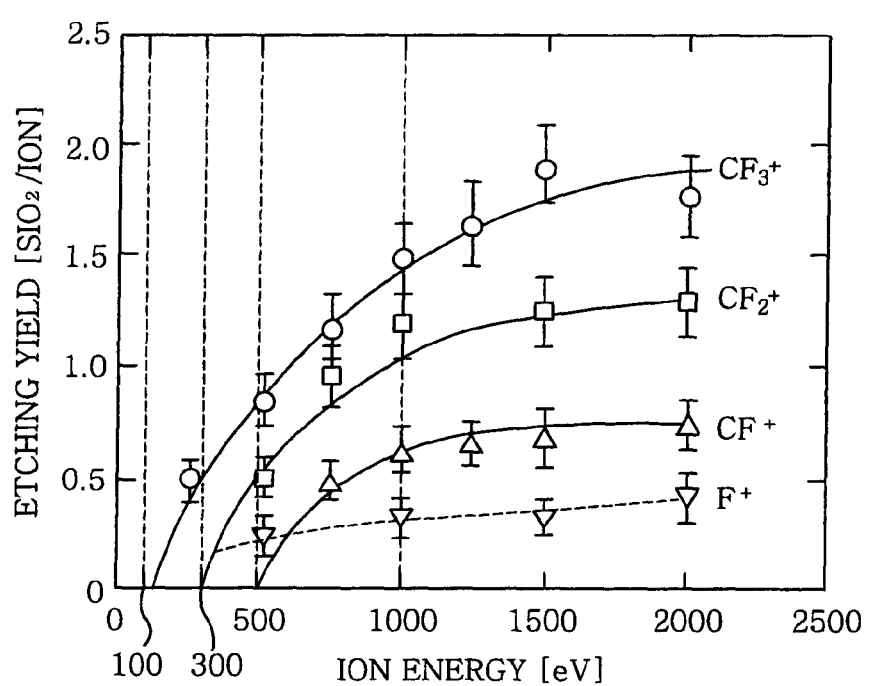
FIG. 6 is a graph showing a relationship between an etching yield of $SiO_2$ by $CF_x^+$ ions and an ion energy.

Further, the value of the DC voltage applied to the upper electrode 34 is an important factor for facilitating the interaction between the electrode plate 36 and the $Ar^+$ ions or the CF ions in the plasma. FIG. 6 presents a graph to describe a relationship between an ion energy and an etching yield of $SiO_2$ (here, $SiO_2$ is considered to be an equivalent to the Si of the electrode plate 36 of the upper electrode 34) by CF ions in the plasma. As can be understood from FIG. 6, if the $CF^+$ ion is not of an ion energy equal to or greater than 500 eV or if the $CF_2^+$ ion is not of an ion energy equal to or greater than 300 eV, the etching of the $SiO_2$ cannot be carried out. Accordingly, it is believed that, in a range where the ion energy is lower than 100 eV, the CF ions merely cause deposits, so the interaction (e.g., etching) with the Si or the $SiO_2$ may be hardly generated.

Figure 7:
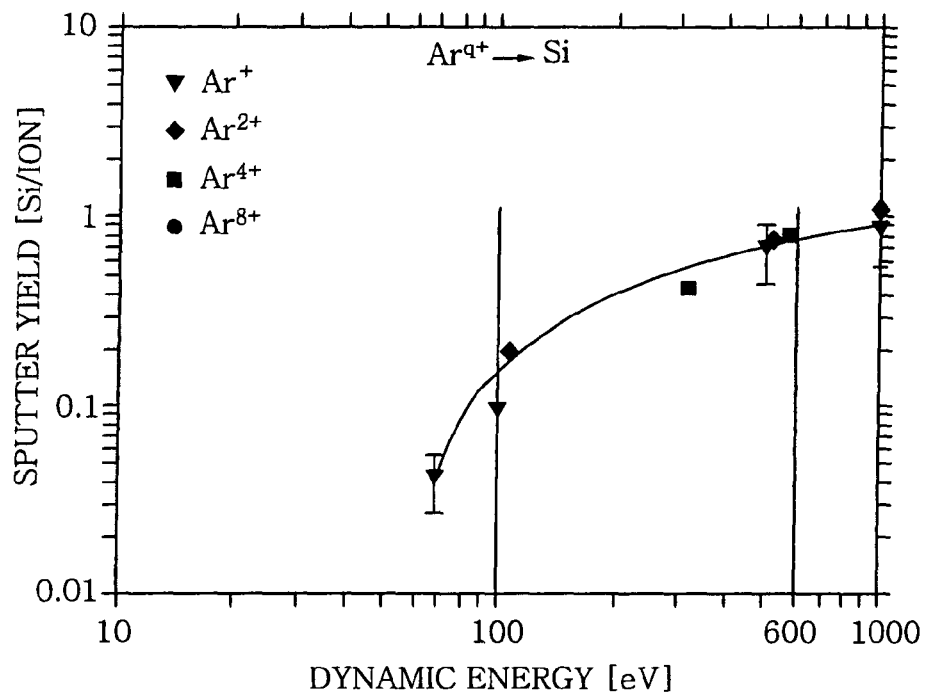
FIG. 7 is a graph showing a relationship between a sputter yield of Si by Ar ions in a plasma and a dynamic energy.

Meanwhile, FIG. 7 shows a graph to describe a relationship between a dynamic energy and a sputter yield of Si by Ar ions in the plasma. On a vertical axis of the graph, an effective sputter yield for reducing the number of the F radicals starts from a reference value of 0.1 (Si/ion). As can be seen from FIG. 7, a dynamic energy of about 100 eV to 600 eV is necessary to trigger an interaction (sputtering) between the Ar ions ($Ar^+$, $Ar^{2+}$, $Ar^{4+}$, $Ar^{8+}$) and the electrode plate 36 of the upper electrode on which a CF thin film is formed.

From the results of the $SiO_2$ etching yield by the CF ions (in FIG. 6) and the Si sputter yield by the Ar ions (in FIG. 7), it is understood that the absolute value of the DC voltage applied to the upper electrode 34 needs to be 100 V or higher. Meanwhile, even when an excessively high DC voltage is applied to the upper electrode 34, since the etching yield or the sputter yield reaches its maximum level and so the emission of Si from the electrode plate 36 becomes maximized, a further improvement of the etching selectivity due to the scavenging effect of the F radicals is deemed unexpectable. Therefore, an upper limit of the absolute value of the negative DC voltage applied to the upper electrode 34 needs to set to be in a range from about 900 to 1500 V, preferably.

The above considerations are verified by the results of the following experiments.

In an experiment, etching was performed by using the plasma etching apparatus 100 on a laminated body including a SiC film as a base layer 101, a SiOC film as the etching target layer 102, and a resist layer 103 of ArF having a pattern formed thereon, while employing the resist layer 103 as a mask. The etching was performed under the following conditions to form recesses (holes) 110 in the SiOC film of the target etching layer 102.

(Etching Conditions)
Processing gas: $C_4F_8$, Ar and $N_2$;
Flow rate of the processing gas ($C_4F_8$/Ar/$N_2$): 4/1000/130 mL/min (sccm);
Processing pressure: 6.7 Pa (50 mTorr);
Backing pressure (center/edge): 2000 Pa/5332 Pa (15/40 Torr; He gas);
Temperature (upper electrode/chamber sidewall/lower electrode): 90° C./60° C./0° C.;
First RF power of the first RF power supply 89 (40 MHz): 2500 W;
Second RF power of the second RF power supply 90 (2 MHz): 0 W;
DC voltage (upper electrode 34): −300 V, −600 V, −900 V, −1200 V, −1500 V or −1800 V;
Processing time: 78 seconds.

Figure 8:
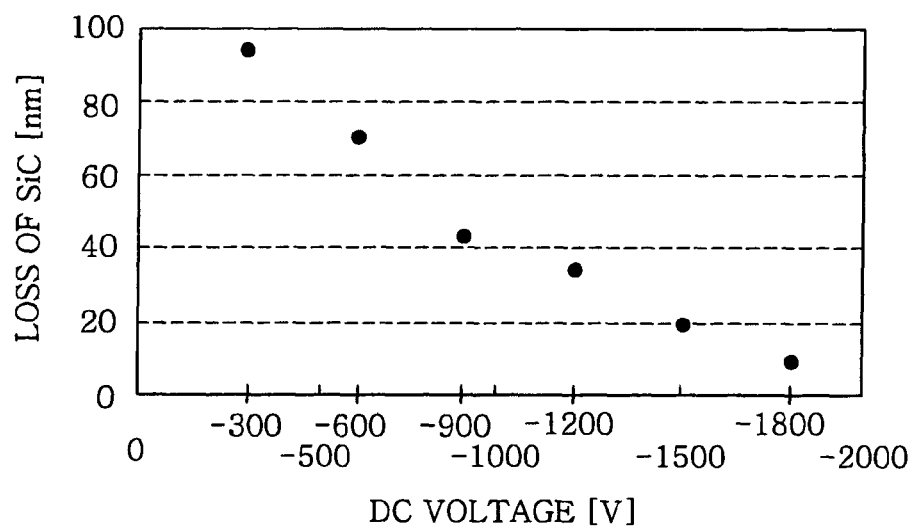
FIG. 8 is a graph showing a relationship between a DC voltage applied to the upper electrode and a loss of a SiC film.

A graph shown in FIG. 8 shows a relationship between a DC voltage applied to the upper electrode 34 and a loss (etched amount) of the thickness of the SiC film serving as the base layer 101. Further, a graph in FIG. 9 describes a relationship between a DC voltage applied to the upper electrode 34 and a selectivity of the SiOC film serving as the target etching layer 102 against the SiC film serving as the base layer 101. As revealed from FIG. 8, if the absolute value of a negative DC voltage applied to the upper electrode 34 increased, the loss of the SiC film decreased. Further, as can be seen from FIG. 9, as the absolute value of the negative voltage applied to the upper electrode 34 increased, the selectivity against the SiC film improved. Particularly, the selectivity against the SiC film improved to 5 or greater when the absolute value of the negative DC voltage was 1000 V or higher.

Figure 9:
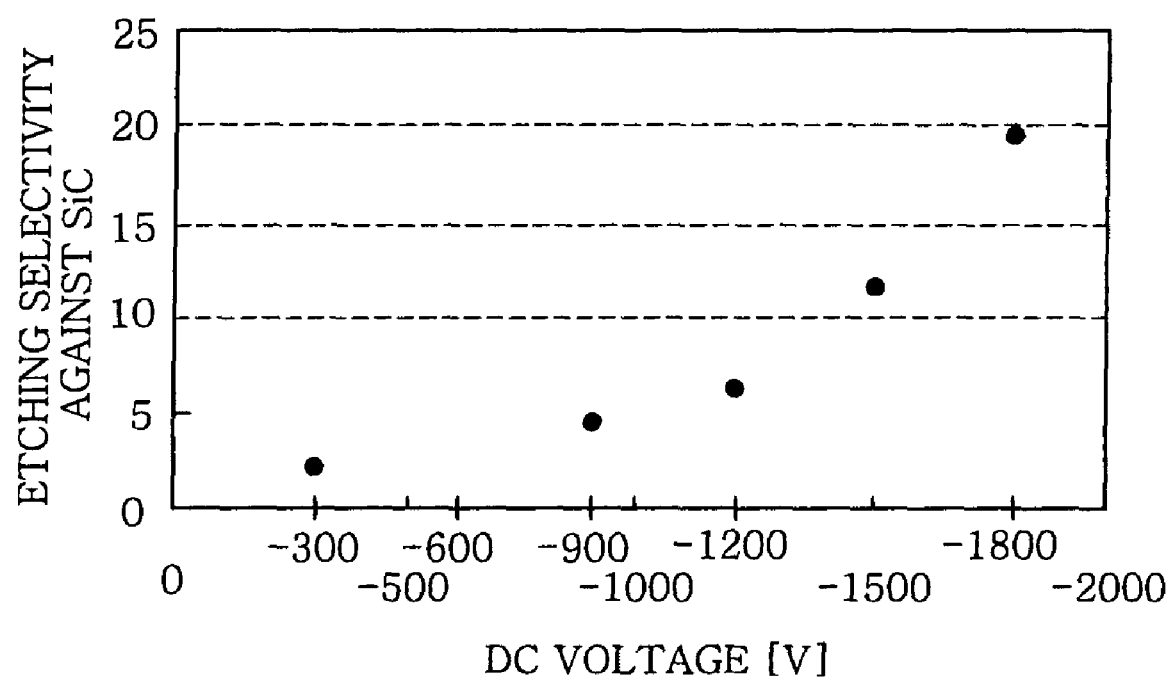
FIG. 9 is a graph showing a relationship between a DC voltage applied to the upper electrode and an etching selectivity of a SiOC film as an etching target layer 102 against a SiC film.

As revealed from the results shown in FIGS. 8 and 9, with the increase of the absolute value of the negative DC voltage applied to the upper electrode 34, the loss of the SiC film decreases, while the etching selectivity against the SiC film increases. Further, as seen from FIG. 9, the selectivity against the SiC film rapidly increases when the DC voltage applied to the upper electrode 34 is about −1000 V or less. Accordingly, it is confirmed that the absolute value of the negative DC voltage applied to the upper electrode 34 needs to preferably set to be 1000 V or higher (i.e., no higher than −1000 V as a DC voltage), in order to etch the SiOC film, i.e., the etching target layer 102, with a sufficient etching selectivity against the SiC film serving as the base layer 101.

Figure 10:
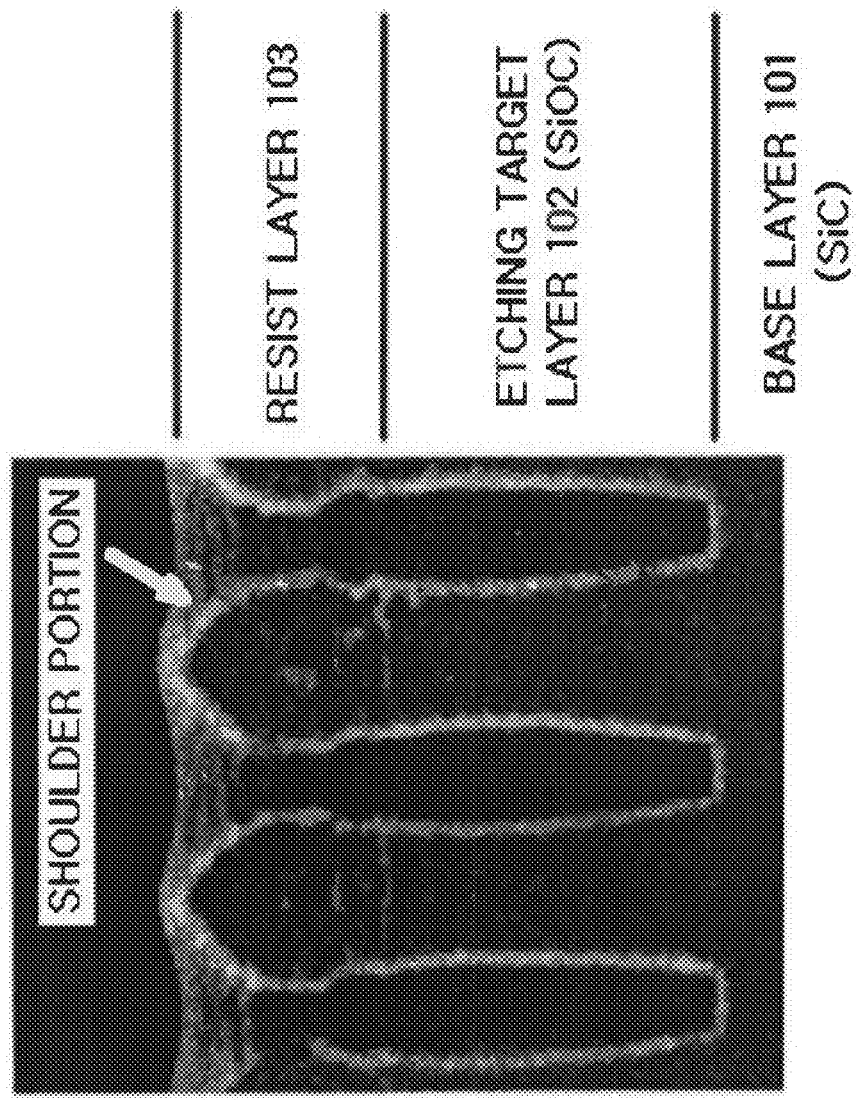
FIG. 10 shows a TEM image of a surface portion of the wafer W.

Meanwhile, FIG. 10 is a TEM (Transmission Electron Microscope) image showing longitudinal cross sections of holes including the resist layer 103 after the etching was performed by applying a DC voltage of −1800 V to the upper electrode in the above experiment. As shown in FIG. 10, shoulder portions of the resist layer 103 were removed to have round shapes, and so the opening diameter of the resist pattern got enlarged. From this result, it is proved that, if an excessively high absolute value of DC voltage is applied to the upper electrode 34, shoulder portions (corner portions) of the resist layer 103 of, e.g., ArF are cut. If the shoulder portions are removed, the opening diameters (in case of holes) or the opening widths (in case of grooves) in the patterned resist layer 103 are enlarged, causing a problem that the opening diameters or the opening widths of the recesses (holes or grooves) 110 are also enlarged after the resist is removed.

Figure 11:
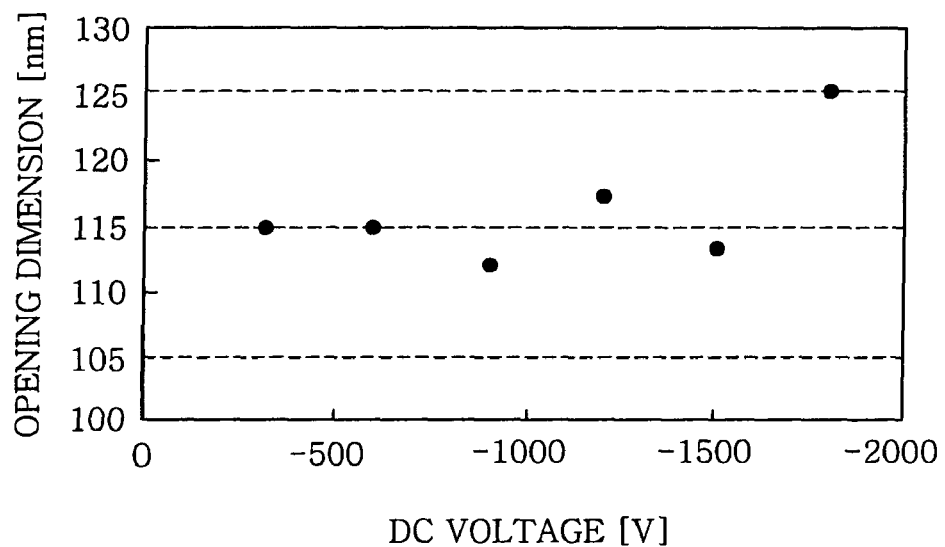
FIG. 11 is a graph showing a relationship between an opening diameter in a top portion of a hole and a DC voltage applied to the upper electrode.

FIG. 11 presents a graph showing a relationship between opening diameters (CD; Critical Dimension) of top portions of holes and a DC voltage applied to the upper electrode 34 in the above experiment. The opening diameter of an initial pattern (a pattern present before the etching is performed) of the resist layer 103 used as the etching mask was 115 nm. As can be seen from FIG. 11, if the absolute value of the negative DC voltage applied to the upper electrode 34 reached 1800 V, the opening diameters were rapidly enlarged. However, if the absolute value of the negative DC voltage applied to the upper electrode 34 was equal to or lower than 1500 V (i.e., if the DC voltage is equal to or higher than −1500 V), the increase of the CD was substantially suppressed, so that the ratio of the opening diameter of the etching target layer 102 formed by the etching to the opening diameter of the initial pattern of the resist layer 103 fell within a range of about 1.2 or less.

As confirmed from the above results, it is preferable to set the absolute value of the negative DC voltage applied to the upper electrode 34 to be 1000 V or higher, in order to improve the etching selectivity of the SiOC film of the etching target layer 102 against the SiC film of the base layer 101. Meanwhile, in the aspect of preventing the shoulder damage of the resist layer 103 to thereby suppress the enlargements of the recesses 110, it is preferable to set the absolute value of the negative DC voltage applied to the upper electrode 34 to be not greater than 1500 V.

Now, an experiment result of the plasma etching method in accordance with the second embodiment of the present invention will be explained with reference to FIGS. 12 and 13.

Figure 12:
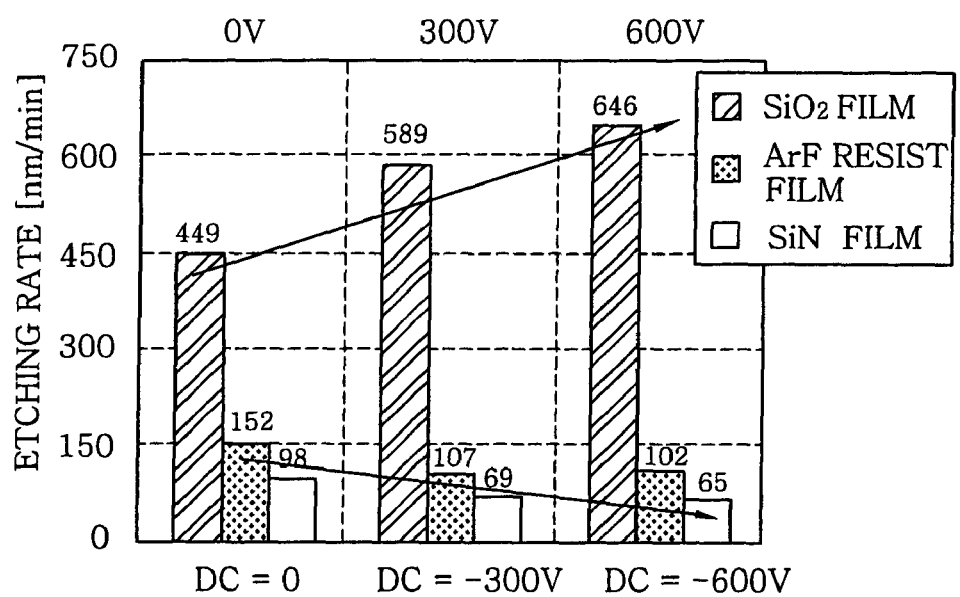
FIG. 12 is a graph showing a relationship between respective etching rates of different films and a DC voltage.

First, etching was performed for each of a $SiO_2$ film, an ArF resist film and a SiN film under the following conditions, and the results are provided in FIG. 12.

(Etching Conditions)
Processing gas: $C_4F_8$, Ar and $O_2$;
Flow rate of the processing gas ($C_4F_8/Ar/O_2$): 60/300/34 mL/min (sccm);
Processing pressure: 2.0 Pa (15 mTorr);
Backing pressure (center/edge): 2000 Pa/5332 Pa (15/40 Torr; He gas);
Temperature (upper electrode/chamber sidewall/lower electrode): 60° C./60° C./0° C.;
First RF power of the first RF power supply 89 (40 MHz): 2700 W;
Second RF power of the second RF power supply 90 (2 MHz): 4500 W;
DC voltage (upper electrode 34): 0 V, −300 V, −600 V;
Processing time: 60 seconds.

As can be seen from FIG. 12, though the etching rate of the $SiO_2$ film increased as the DC voltage applied to the upper electrode 34 raised higher, the etching rates of the ArF resist film and the SiN film decreased on the contrary. Accordingly, if the SiN film was the base layer 101 and the $SiO_2$ film was the etching target layer 102 and the ArF resist film was the resist layer 103, the etching rate of the etching target layer 102 as well as the etching selectivity of the etching target layer 102 against the base layer 101 and the resist layer 103 would be improved greatly by applying the DC voltage.

Then, in case when the base layer 101 was a Si layer (single crystalline) or a SiN film, and the etching target layer 102 was $SiO_2$, etching of the etching target layer 102 was performed based on the pattern of the resist layer 103 of ArF while using the base layer 101 as an etching stopper under the following conditions, and an etching rate was measured. The result is provided in FIG. 13.

(Etching Conditions)
Processing gas: $C_4F_6$, $C_4F_8$, Ar and $O_2$;
Flow rate of the processing gas: flow rates of $C_4F_6/C_4F_8/Ar$ was fixed at 20/50/250 mL/min (sccm), while the flow rate of $O_2$ is varied from 50 to 60, 80 and 90 mL/min (sccm);
Processing pressure: 4.0 Pa (30 mTorr);
Backing pressure (center/edge): 2000 Pa/5332 Pa (15/40 Torr; He gas);
Temperature (upper electrode/chamber sidewall/lower electrode): 90° C./60° C./0° C.;
first RF power of the first RF power supply 89 (40 MHz): 2000 W;
second RF power of the second RF power supply 90 (2 MHz): 3000 W;
DC voltage (upper electrode 34): 0 V ($O_2$ flow rate: 50 mL/min), −450 V ($O_2$ flow rate: 60 mL/min), −900 V ($O_2$ flow rate: 80 mL/min) or −1200 ($O_2$ flow rate: 90 mL/min);
Distance (gap) between the upper and the lower electrode: 35 mm;
Processing time: 120 seconds.

Figure 13:
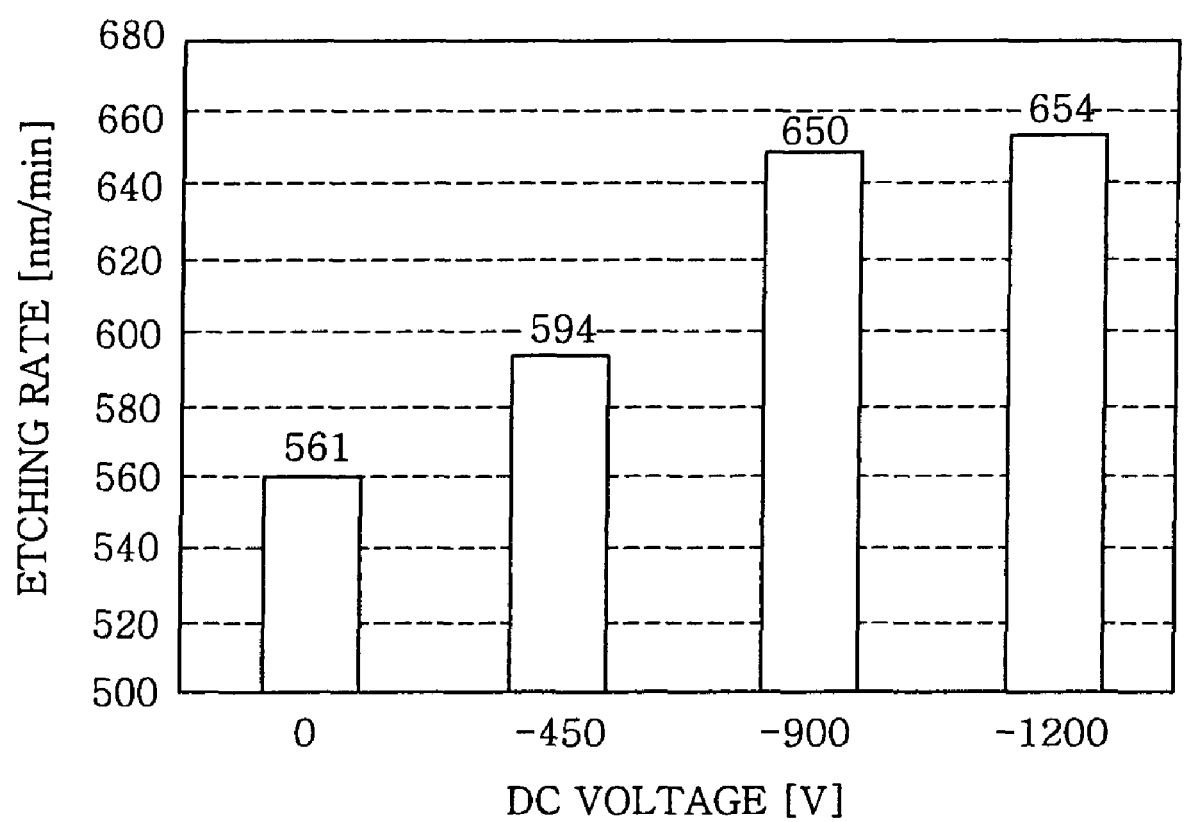
FIG. 13 is a graph showing a relationship between a DC voltage applied to the upper electrode and an etching rate.

As revealed from FIG. 13, the etching rate increased as the absolute value of the negative DC voltage applied to the upper electrode 34 became higher. Further, if the DC voltage fell below −900 V (i.e., if the absolute value thereof was greater than 900 V), the increment of the etching rate reached its maximum, and the effect of the DC voltage application was weakened. From this result, it is confirmed that it is preferable to set the absolute value of the negative DC voltage applied to the upper electrode 34 to be not greater than 900 V in the plasma etching method in accordance with the second embodiment.

As described above, by appropriately controlling the DC voltage applied from the variable DC power supply 50 to the upper electrode by the controller 51, the etching or the sputtering effect on the electrode plate 36 of the upper electrode 34 can be effectively exerted. As a result, F radicals in the processing gas are consumed by the reaction with Si emitted from the electrode plate 36, so that the etching selectivity of the etching target layer 102 against the base layer 101 can be improved.

Moreover, by controlling the DC voltage applied to the upper electrode 34 to be confined within an appropriate range, a shoulder damage of the resist layer 103 can be prevented, and increases (enlargement) of CDs (opening diameter or opening width) of the recesses 110, e.g., holes or grooves, formed by the etching can be suppressed. As a result, a higher-density pattern formation becomes possible.

Further, the application of the DC voltage to the upper electrode 34 has an additional effect other than those described above. That is, since a plasma is generated by the DC voltage applied, a plasma density can be increased independently of a control of the plasma density by the output of the RF power from the first RF power supply 89, so that the etching rate can be further improved. This effect becomes achievable because, if the negative DC voltage is applied to the upper electrode 34, an electron density (plasma density) increases. That is, an entrance of electrons into the upper electrode 34 becomes difficult by applying the negative DC voltage, so that the extinguishment of the electrons is suppressed, resulting in the increase in an electron density. Also, the electron density is further increased because electrons escaped from the upper electrode 34 as a result of the entrance of accelerated ions into the upper electrode 34 are accelerated to a high speed due to a difference between a plasma potential and the applied DC voltage, thus ionizing a neutral gas (i.e., converting the gas into plasma).

It is to be noted that the present invention can be modified in various ways without being limited to the embodiments described above. For example, a target substrate to be processed is not limited to a semiconductor wafer, and it may be a glass substrate for, e.g., a liquid crystal display (LCD), a ceramic substrate or the like.

Further, though the DC voltage is applied from the variable DC power supply 50 to the upper electrode 34 in the above embodiments, it is also possible to apply an RF power of a frequency lower than, e.g., about 4 MHz to the upper electrode 34 in place of applying the DC voltage. In such case, silicon can be emitted from the electrode plate 36 by an interaction between the upper electrode 34 and ions, reducing the number of F radicals in the plasma and thus improving the etching selectivity against the base layer.

Moreover, the above embodiments have been described for the case of using the plasma etching apparatus of a type in which dual RF powers of different frequencies are applied to the lower electrode, wherein the first RF power for plasma generation and the second RF power for ion attraction are both applied to the lower electrode. However, it is also possible to employ a plasma etching apparatus of a type in which a single RF power is applied to the lower electrode.

While the invention has been shown and described with respect to the embodiment, it will be understood by those skilled in the art that various changes and modifications may be made without departing from the scope of the invention as defined in the following claims.

What is claimed is:

1. A plasma processing method for processing a target substrate, which, at least, includes a resist layer having a pattern formed thereon; an etching target layer composed of a silicon dioxide ($SiO_2$) film under the resist layer; and a base layer composed of a single crystalline layer or a silicon nitride (SiN) film under the etching target layer, by using a plasma processing apparatus including a vacuum evacuable processing vessel that accommodates the target substrate therein; a lower electrode disposed in the processing vessel and connected to a first RF power supply applying an RF power of a first frequency for plasma generation and a second RF power supply applying an RF power of a second frequency for ion attraction, the lower electrode also serving as a mounting table for mounting the target substrate thereon; and an upper electrode disposed to face the lower electrode and only connected to a DC supply, the method comprising:

loading the target substrate into the processing vessel;

supplying a processing gas containing fluorocarbon in the processing vessel;

generating a plasma of the processing gas in the processing vessel by applying to the lower electrode the RF power of the first frequency from the first RF power supply and the RF power of the second frequency from the second RF power supply;

applying a voltage consisting essentially of a negative DC voltage to the upper electrode; and etching the etching target layer of the silicon dioxide ($SiO_2$) film, by the plasma by using the resist layer as an etching mask, thus forming recesses on the etching target layer, wherein the negative DC voltage has an absolute value ranging from 100 V to 900 V to obtain a high etching rate of the silicon dioxide ($SiO_2$) film and a high etching selectivity of the silicon dioxide ($SiO_2$) film against the base layer of the single crystalline layer or the silicon nitride (SiN) film.

2. A plasma processing method for processing a target substrate, which, at least, includes a resist layer having a pattern formed thereon; an etching target layer composed of a low-k insulating film under the resist layer; and a base layer composed of one of a silicon carbide (SiC), a silicon nitride (SiN) or a silicon carbonitride (SiCN) film under the etching target layer, by using a plasma processing apparatus including a vacuum evacuable processing vessel that accommodates the target substrate therein; a lower electrode disposed in the processing vessel and connected to a first RF power supply applying an RF power of a first frequency for plasma generation and a second RF power supply applying an RF power of a second frequency for ion attraction, the lower electrode also serving as a mounting table for mounting the target substrate thereon; and an upper electrode disposed to face the lower electrode and only connected to a DC supply, the method comprising:

loading the target substrate into the processing vessel;

supplying a processing gas containing fluorocarbon in the processing vessel;

generating a plasma of the processing gas in the processing vessel by applying to the lower electrode the RF power of the first frequency from the first RF power supply and the RF power of the second frequency from the second RF power supply;

applying a voltage consisting essentially of a negative DC voltage to the upper electrode; and etching the etching target layer of the low-k insulating film by the plasma by using the resist layer as an etching mask, thus forming recesses on the etching target layer, wherein the negative DC voltage has an absolute value not less than 1000 V to obtain a high etching rate of the low-k insulating film and an etching selectivity of about 5 or higher, the etching selectivity being an etching selectivity of the low-k insulating film against the base layer of one of the silicon carbide (SiC), the silicon nitride (SiN) and the silicon carbonitride (SiCN) film, and wherein the negative DC voltage has an absolute value not larger than 1500 V such that a ratio of an opening diameter of the recesses to an opening diameter of an initial pattern of the resist layer is not greater than 1.2.

3. The plasma processing method of claim 1, wherein the upper electrode is made of a silicon-containing material.

4. The plasma processing method of claim 2, wherein the upper electrode is made of a silicon-containing material.

5. The plasma processing method of claim 1, wherein the fluorocarbon gas is $C_4F_8$, $C_5F_8$, $C_4F_6$ or $C_6F_6$.

6. The plasma processing method of claim 2, wherein the fluorocarbon gas is $C_4F_8$, $C_5F_8$, $C_4F_6$ or $C_6F_6$.

* * * * *